US008829397B2

(12) United States Patent
Kano et al.

(10) Patent No.: US 8,829,397 B2
(45) Date of Patent: Sep. 9, 2014

(54) CORROSION-RESISTANT MULTILAYER CERAMIC MEMBER

(75) Inventors: Shoji Kano, Gunma (JP); Waichi Yamamura, Gunma (JP); Yoshihiro Kubota, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 924 days.

(21) Appl. No.: 12/285,108

(22) Filed: Sep. 29, 2008

(65) Prior Publication Data

US 2009/0107635 A1 Apr. 30, 2009

(30) Foreign Application Priority Data

Oct. 26, 2007 (JP) .................................. 2007-278774

(51) Int. Cl.
| | | |
|---|---|---|
| *H05B 3/68* | (2006.01) | |
| *C23C 16/00* | (2006.01) | |
| *H01L 21/683* | (2006.01) | |
| *H02N 13/00* | (2006.01) | |
| *H01L 21/687* | (2006.01) | |
| *H05B 3/14* | (2006.01) | |
| *H01L 21/67* | (2006.01) | |

(52) U.S. Cl.
CPC ............ *H01L 21/6831* (2013.01); *H02N 13/00* (2013.01); *H01L 21/6833* (2013.01); *H01L 21/68757* (2013.01); *H05B 3/143* (2013.01); *H01L 21/67103* (2013.01)
USPC ........................................ 219/444.1; 118/725

(58) Field of Classification Search
USPC ............ 219/443.1–468.2, 543–548; 118/724, 118/725; 361/233–235
See application file for complete search history.

(56) References Cited

U.S. PATENT DOCUMENTS

| 5,280,156 | A | * | 1/1994 | Niori et al. ..................... 219/385 |
|---|---|---|---|---|
| 6,160,244 | A | * | 12/2000 | Ohashi ........................ 219/444.1 |
| 6,272,002 | B1 | * | 8/2001 | Mogi et al. ..................... 361/234 |
| 7,044,399 | B2 | * | 5/2006 | Goto et al. ........................ 237/76 |
| 7,369,393 | B2 | * | 5/2008 | Zandi et al. ..................... 361/234 |
| 2002/0023914 | A1 | | 2/2002 | Kitagawa et al. |
| 2002/0185487 | A1 | * | 12/2002 | Divakar et al. ............. 219/444.1 |
| 2004/0177812 | A1 | | 9/2004 | Goto et al. |

FOREIGN PATENT DOCUMENTS

| EP | 1 845 753 A2 | 10/2007 |
|---|---|---|
| JP | A-03-236186 | 10/1991 |
| JP | A-06-140132 | 5/1994 |
| JP | A-06-157172 | 6/1994 |
| JP | A-08-227933 | 9/1996 |
| JP | A-08-264550 | 10/1996 |

(Continued)

OTHER PUBLICATIONS

Jun. 18, 2012 Office Action issued in Taiwanese Patent Application No. 097137276 (with translation).

*Primary Examiner* — Sang Y Paik
(74) *Attorney, Agent, or Firm* — Oliff PLC

(57) ABSTRACT

The present invention relates to a corrosion-resistant multilayer ceramic member consisting at least of: a ceramic support substrate; an electrode layer formed on the ceramic support substrate; a power-supply member connected to the electrode layer; an insulating protection layer formed on the ceramic support substrate to cover the electrode layer; and a ceramic protection substrate of which at least a part is provided on the insulating protection layer. Thereby, there is provided a long-life corrosion-resistant multilayer ceramic member excellent in corrosion resistance even when exposed to a corrosive gas.

4 Claims, 6 Drawing Sheets

(56) References Cited

FOREIGN PATENT DOCUMENTS

| JP | A-2000-114358 | 4/2000 |
| JP | A-2001-332525 | 11/2001 |
| TW | 442888 B | 6/2001 |
| TW | 546984 B | 8/2003 |

* cited by examiner (A)

(B)

(A)

(B)

(A)

(B)

(A)

(B)

(A)

(B)

CORROSION-RESISTANT MULTILAYER CERAMIC MEMBER

BACKGROUND OF THE INVENTION

1. Field of the Invention

The present invention relates to a ceramic member such as a ceramic heater or an electrostatic chuck suitably used for a heating process and the like of a semiconductor wafer in a production process and an inspection process of a semiconductor device.

2. Description of the Related Art

An art of forming a polysilicon film, an oxide film, a conductive film, a dielectric film and the like with a CVD apparatus or a sputtering system on a semiconductor wafer or, in contrast, an art of etching these films with an etching apparatus is well-known in producing a semiconductor device. In order to heat the semiconductor wafer in each process such as forming a film, etching mentioned above, these apparatuses are provided with a ceramic member provided with an electrode such as an electrostatic chuck, a heater, and an RF electrode, for example.

There is proposed a ceramic heater produced by using aluminum nitride substrate as a first ceramic substrate and combining a conductive layer formed on the substrate and a second aluminum nitride substrate covering the conductive layer with the first substrate by simultaneous burning (Japanese Patent Application Laid-Open Publication No. H03-236186). It is said that the ceramic heater thus structured has high thermal conductivity and that a surface thereof is heated with a homogeneous temperature distribution. However, the ceramic heater has the disadvantage of short life because of the damage caused by use at a high temperature or under rapid heating and cooling.

SUMMARY OF THE INVENTION

Such being the case, there is devised a ceramic heater having resistance to a thermal shock such as rapid heating and cooling produced by using a ceramic substrate of aluminum nitride, a conductive layer formed thereon, and a sprayed coating film of alumina deposited and coated on the conductive layer (Japanese Patent Application Laid-Open Publication No. H06-157172).

Apart from the above-mentioned ceramic heater, as a heater used in a production process of semiconductor products, there is devised and utilized a ceramic heater produced by joining an electrode of a metal such as molybdenum or tungsten, silicon carbide, pyrolytic graphite or the like as a heating body to an insulating ceramic substrate such as pyrolytic boron nitride or aluminum nitride and further coating an insulating ceramic film such as pyrolytic boron nitride thereon. Furthermore, there are also devised an electrostatic chuck, an electrostatic chuck with the function of a heater and the like that are similarly structured (Japanese Patent Application Laid-Open Publication No. H06-140132, Japanese Patent Application Laid-Open Publication No. H08-227933, Japanese Patent Application Laid-Open Publication No. H08-264550).

However, a corrosive gas such as a chlorinated gas or a fluorinated gas is used in an apparatus for producing a semiconductor as a gas for deposition, a gas for etching, or a gas for cleaning. As a result, when a conventional multilayer ceramic heater or an electrostatic chuck, having the electrode surface coated in the above-mentioned structure, is used continuously for a long time, the original function thereof is sometimes lost by corrosion of the coated member to the electrode or corrosion of the electrode eroded from a coated or joined part resulting from exposure to the corrosive gas mentioned above.

The present invention was accomplished in order to solve such problems as mentioned above and an object of the present invention is to provide a long-life corrosion-resistant multilayer ceramic member excellent in corrosion resistance even when exposed to the corrosive gas as described above.

To solve above mentioned problems and to achieve that object, the present invention is a corrosion-resistant multilayer ceramic member consisting at least of: a ceramic support substrate; an electrode layer formed on the ceramic support substrate; a power-supply member connected to the electrode layer; an insulating protection layer formed on the ceramic support substrate to cover the electrode layer; and a ceramic protection substrate of which at least a part is provided on the insulating protection layer.

In the corrosion-resistant multilayer ceramic member structured as described above, the insulating protection layer formed on the ceramic support substrate to cover the electrode layer, is in no danger of being directly exposed to a corrosive gas because the insulating protection layer is covered with the ceramic protection substrate. Therefore the corrosion resistance thereof is greatly improved and the decrement of the electrode layer can be prevented.

Here, on this occasion, the ceramic protection substrate preferably extends over side surface of the ceramic support substrate.

In a corrosion-resistant multilayer ceramic member of the present invention, when the ceramic protection substrate of which at least a part is provided on the insulating protection layer, extends over side surface of the ceramic support substrate, invasion of a corrosive gas from the joined part can be prevented and the corrosion resistance can be improved further.

Furthermore, in a corrosion-resistant ceramic member of the present invention, preferably, a cylindrical column is attached to the ceramic protection substrate and an end of the power-supply member is inserted inside the cylindrical column. Furthermore, in contrast, a cylindrical column may be attached to the ceramic support substrate and an end of the power-supply member may be inserted inside the cylindrical column.

When the cylindrical column is attached to the ceramic protection substrate or the ceramic support substrate and the end of the power-supply member is inserted inside the cylindrical column, the power-supply member is protected from the corrosive gas and a longer-life corrosion-resistant multilayer ceramic member is obtained.

Furthermore, preferably, the ceramic protection substrate further extends over a surface of the ceramic support substrate that is opposite to the surface having the electrode layer formed thereon; and the ceramic protection substrate is further provided with a cylindrical column attached thereto, and an end of the power-supply member is inserted inside the cylindrical column.

By further extends a ceramic protection substrate over the surface of the ceramic support substrate that is opposite to the surface having the electrode layer formed thereon, invasion of the corrosive gas is greatly prevented. Furthermore, by further providing the cylindrical column for the ceramic protection substrate attached thereto, and inserting the end of the power-supply member inside the cylindrical column, the power-supply member can be protected from the corrosive gas and a longer-life corrosion-resistant multilayer ceramic member can be obtained.

Furthermore, a protection film 0.01 mm or more in thickness is preferably coated to seal in at least one of surface boundary lines at which the ceramic support substrate, the insulating protection layer, the ceramic protection substrate, or the cylindrical column meet with each other or itself.

When the protection film 0.01 mm or more in thickness is coated to seal in at least one of surface boundary lines at which the ceramic support substrate, the insulating protection layer, the ceramic protection substrate, or the cylindrical column meet with each other or itself as described above, invasion of the corrosive gas to the surface boundary, where the corrosion resistance is relatively poor, can be prevented and life can be increased further.

Furthermore, the protection film is preferably made of any one of aluminum nitride, rare earth oxide, yttrium fluoride, aluminum oxide, silicon oxide, zirconia, and sialon.

When the protection film, having the thickness of 0.01 mm or more and being coated to seal in at least one of surface boundary lines at which the ceramic support substrate, the insulating protection layer, the ceramic protection substrate, or the cylindrical column meet with each other or itself, is made of any one of aluminum nitride, rare earth oxide, yttrium fluoride, aluminum oxide, silicon oxide, zirconia, and sialon, the corrosion resistance of the protection film itself is further improved and invasion of the corrosive gas to the joining surface, where the corrosion resistance is relatively poor, is completely prevented.

Furthermore, the ceramic support substrate, the ceramic protection substrate, and the insulating protection layer preferably contain as a main component any one of aluminum nitride, rare earth oxide, aluminum oxide, silicon oxide, zirconia, and sialon.

When the ceramic support substrate, the ceramic protection substrate, and the insulating protection layer contain as the main component any one of aluminum nitride, rare earth oxide, aluminum oxide, silicon oxide, zirconia, and sialon as mentioned above, the corrosion-resistant multilayer ceramic member has greater corrosion resistance.

Furthermore, the insulating protection layer is preferably formed by any one of screen printing method, chemical vapor deposition method, and plasma spraying method and the electrode layer is preferably formed by any one of screen printing method, chemical vapor deposition method, and plasma spraying method.

When the insulating protection layer is formed by any one of screen printing method, chemical vapor deposition method, and plasma spraying method and the electrode layer is formed by any one of screen printing method, chemical vapor deposition method, and plasma spraying method as mentioned above, the insulating protection layer and the electrode layer obtained are excellent in homogeneity. Moreover, because the insulating protection layer and the electrode layer excellent in homogeneity are formed with ease, a corrosion-resistant multilayer ceramic member is obtained with a high yield and at a low cost.

Furthermore, the corrosion-resistant multilayer ceramic member is preferably any one of a heater for heating, an electrostatic chuck, and a heater for heating provided with an electrostatic chuck.

When a corrosion-resistant multilayer ceramic member of the present invention is used as any one of the heater for heating, the electrostatic chuck, and the heater for heating provided with the electrostatic chuck as mentioned above, it is capable of heating by electricity the wafers continuously for a long time even if it is exposed to the corrosive gas used in the production process and the inspection process of semiconductor wafers, for example, thus it is preferable.

The present invention can greatly improve resistance to the corrosive gas by forming an electrode layer on a ceramic support substrate, further forming an insulating protection layer to cover the electrode layer, and at least further providing a ceramic protection substrate on the insulating protection layer. The present invention can also provide a long-life corrosion-resistant multilayer ceramic member. Furthermore, a corrosion-resistant multilayer ceramic member of the present invention is suitably used as an apparatus for heating a semiconductor wafer such as a ceramic heater in the production process and the inspection process of a semiconductor device.

DETAILED DESCRIPTION OF THE PREFERRED EMBODIMENTS

Figure 1:
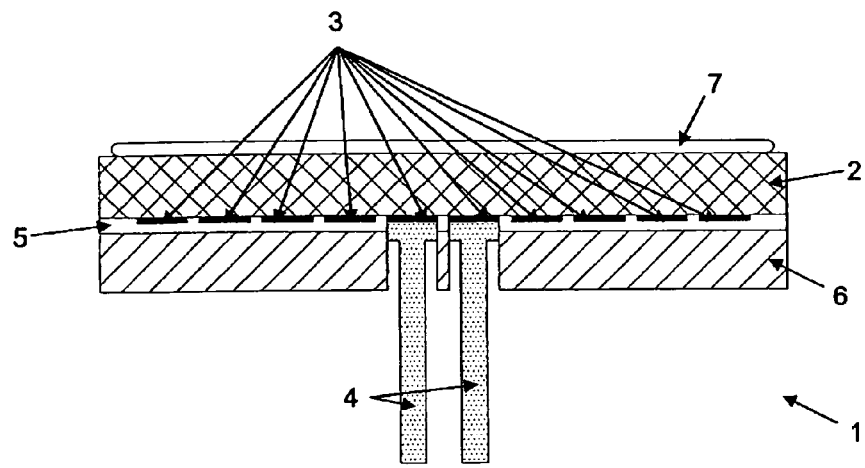
FIG. 1 show an example of a corrosion-resistant multilayer ceramic member of the present invention.
Figure 1:
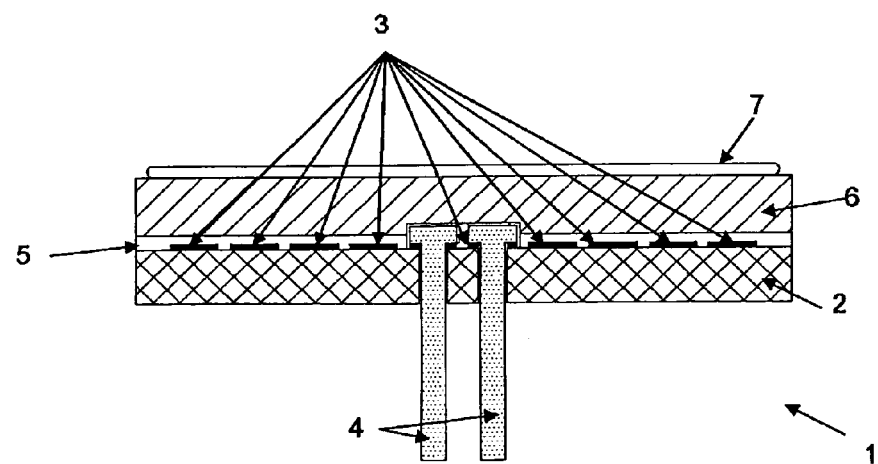
Figure 2:
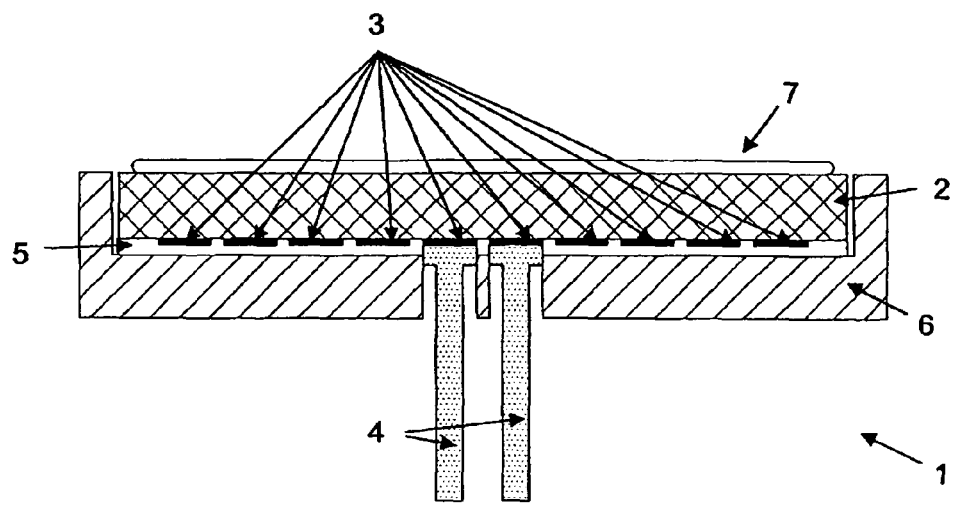
FIG. 2 show other example of a corrosion-resistant multilayer ceramic member of the present invention.
Figure 2:
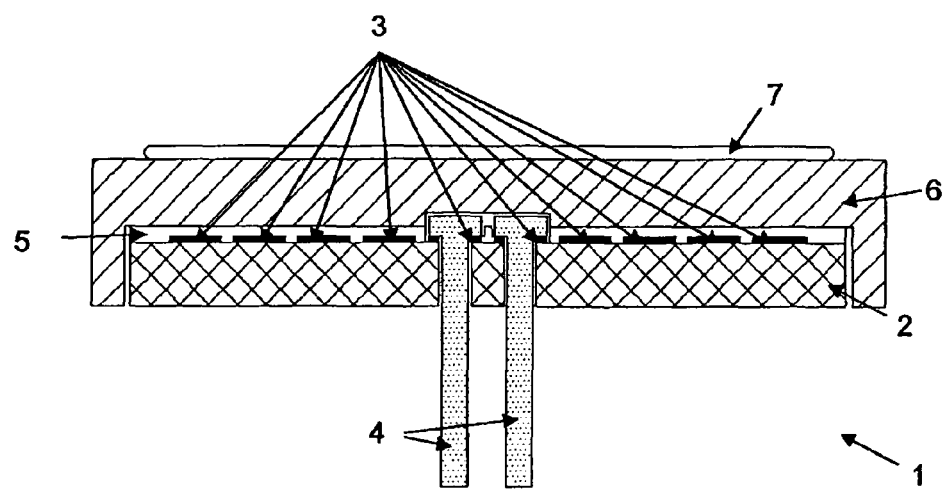
Figure 3:
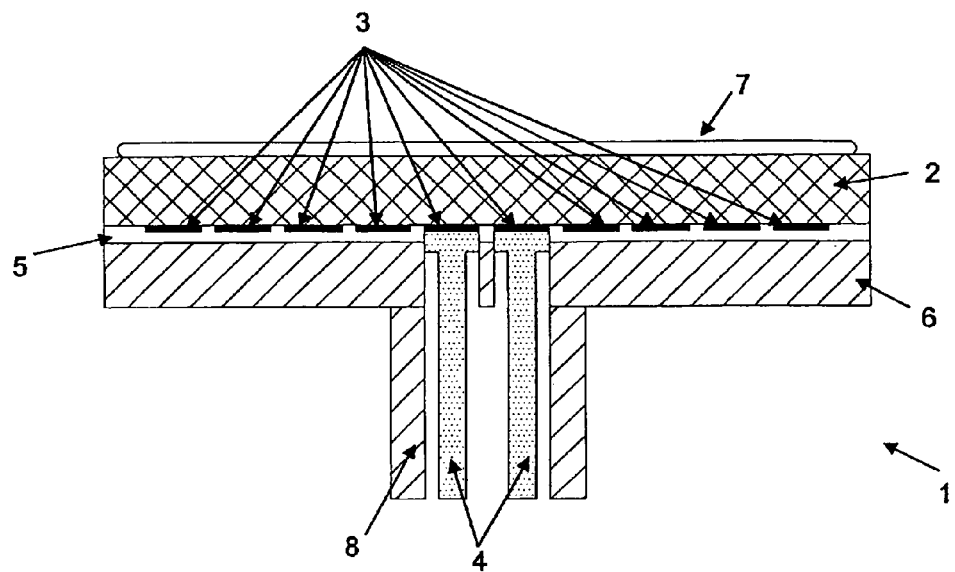
FIG. 3 show other example of a corrosion-resistant multilayer ceramic member of the present invention.
Figure 3:
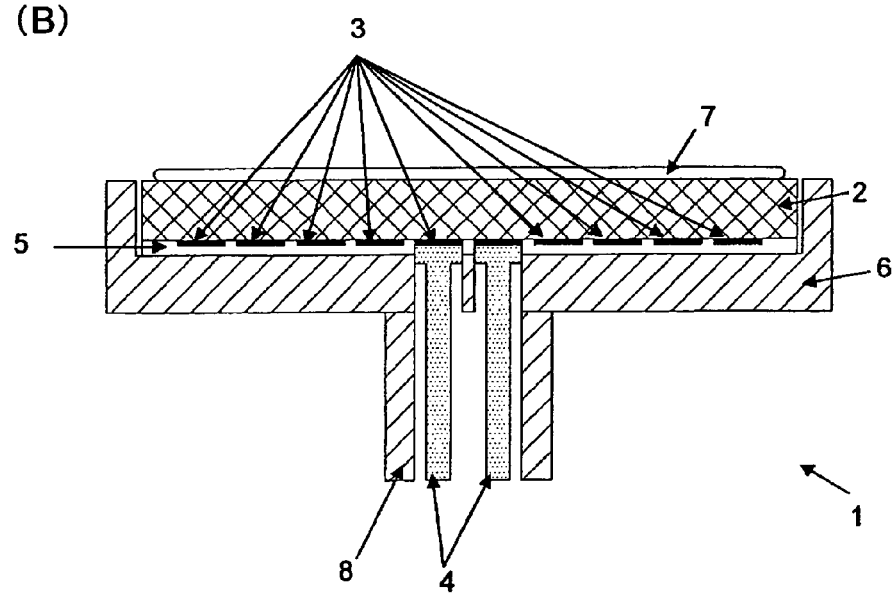
Figure 4:
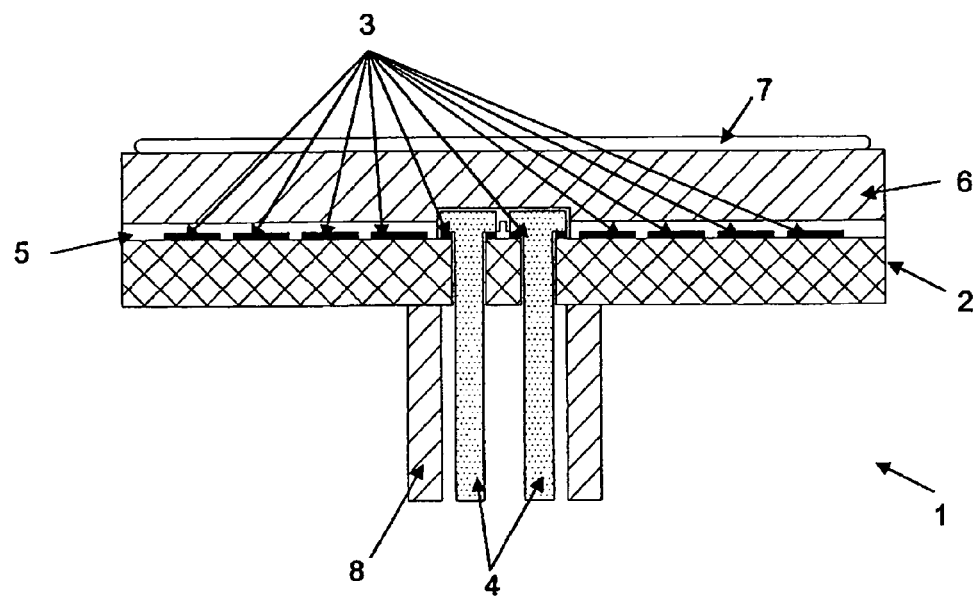
FIG. 4 show other example of a corrosion-resistant multilayer ceramic member of the present invention.
Figure 4:
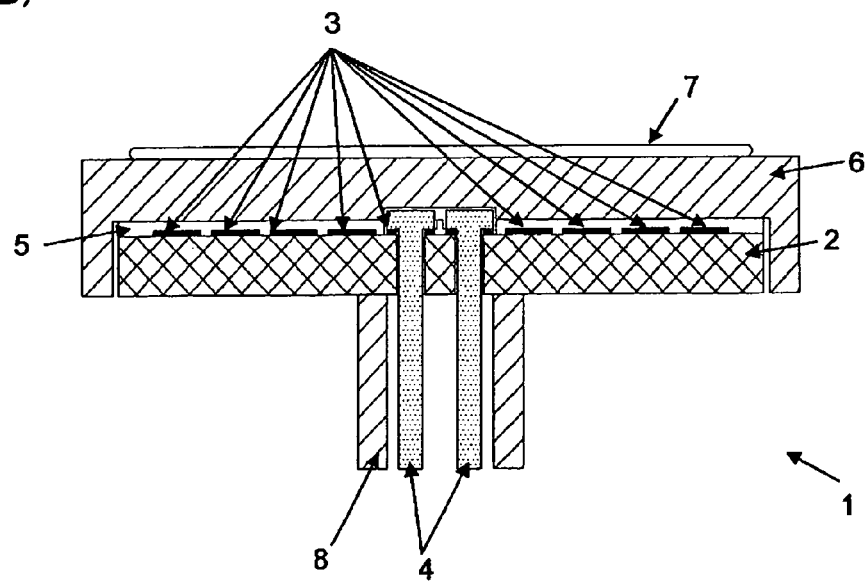

An embodiment of the present invention will now be explained hereinafter by reference to the drawings, but the present invention is not restricted thereto.

Here, FIGS. 1 to 6 are sectional views showing examples of a corrosion-resistant multilayer ceramic member of the present invention.

As shown in FIG. 1(A), in a corrosion-resistant multilayer ceramic member 1 of the present invention, an electrode layer 3 is formed on a surface of a ceramic support substrate 2, a power-supply member 4 is connected to the electrode layer 3, and an insulating protection layer 5 is formed on the ceramic support substrate 2 to cover the electrode layer 3. Furthermore, a ceramic protection substrate 6 of which at least a part is provided on the insulating protection layer 5.

Furthermore, as shown in FIGS. 2(A) and (B), the ceramic protection substrate 6 of which at least a part is provided on the insulating protection layer 5 may be joined in such a manner that the ceramic protection substrate 6 extends over side surface of the ceramic support substrate 2. It should be noted that, hereinafter, a member given the same number represents the same thing.

It should be noted that a corrosion-resistant multilayer ceramic member of the present invention can serve as a heater for heating, an electrostatic chuck, or a heater for heating provided with an electrostatic chuck. When the corrosion-resistant multilayer ceramic member 1 is a heater for heating, the electrode layer 3 is a heater electrode and a heated object 7 such as a silicon wafer can be heated by electricity supplied from the power-supply member 4 connected to the electrode layer 3. As shown in FIG. 1(A) and FIG. 2(A), a surface at a side of the ceramic support substrate 2 may be used as a placing surface of the heated object 7. As shown in FIG. 1(B) and FIG. 2(B), a surface at a side of the ceramic protection substrate 6 may be used as a placing surface of the heated object 7. When a surface at a side of the ceramic support substrate 2 is a placing surface of the heated object, the temperature of the heated object is rapidly raised. When a surface at a side of the ceramic protection substrate 6 is a placing surface of the heated object, the heated object is uniformly heated, thus the choice may be made depending on the use and the like.

Furthermore, the corrosion-resistant multilayer ceramic member 1 of the present invention may be structured, as shown in FIGS. 3(A) and (B), so that a cylindrical column 8 is attached to the ceramic protection substrate 6 and so that an end of the power-supply member 4 is inserted inside the cylindrical column 8. Furthermore, in contrast, the corrosion-resistant multilayer ceramic member 1 of the present invention may be structured, as shown in FIGS. 4(A) and (B), so that the cylindrical column 8 is attached to the ceramic support substrate 2 and so that an end of the power-supply member 4 is inserted inside the cylindrical column 8.

Figure 5:
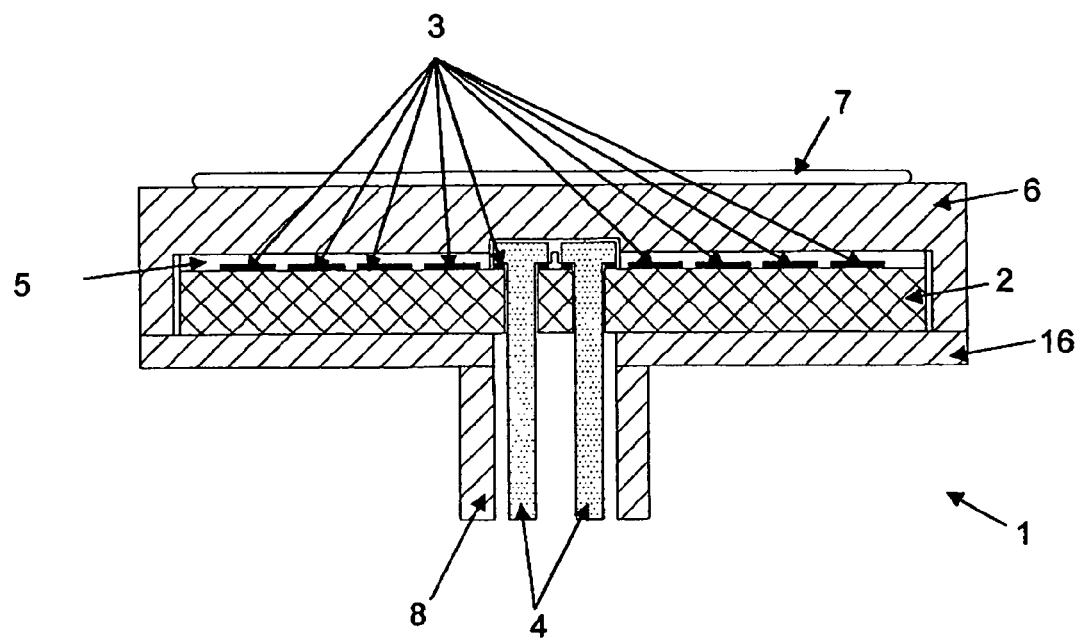
FIG. 5 shows other example of a corrosion-resistant multilayer ceramic member of the present invention.
Figure 6:
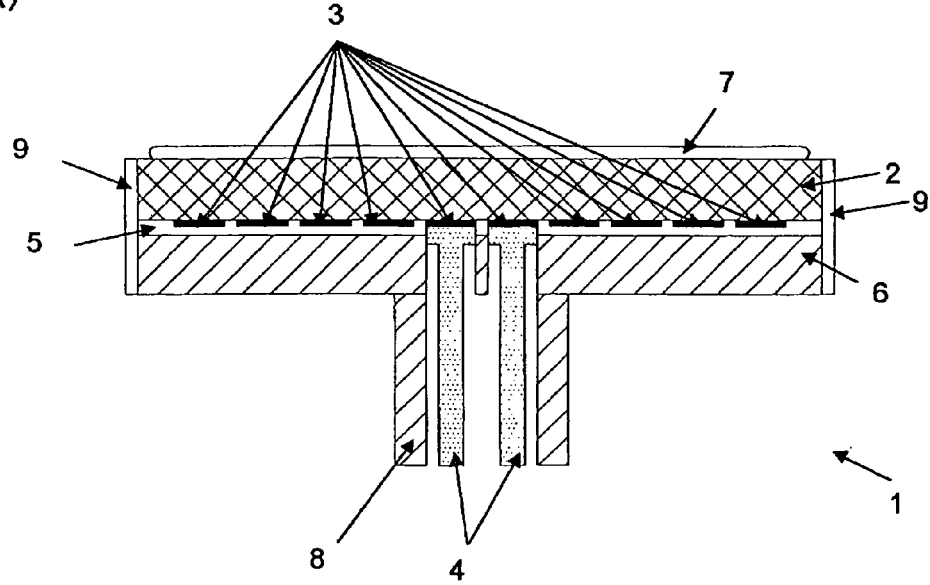
FIG. 6 show other example of a corrosion-resistant multilayer ceramic member of the present invention.
Figure 6:
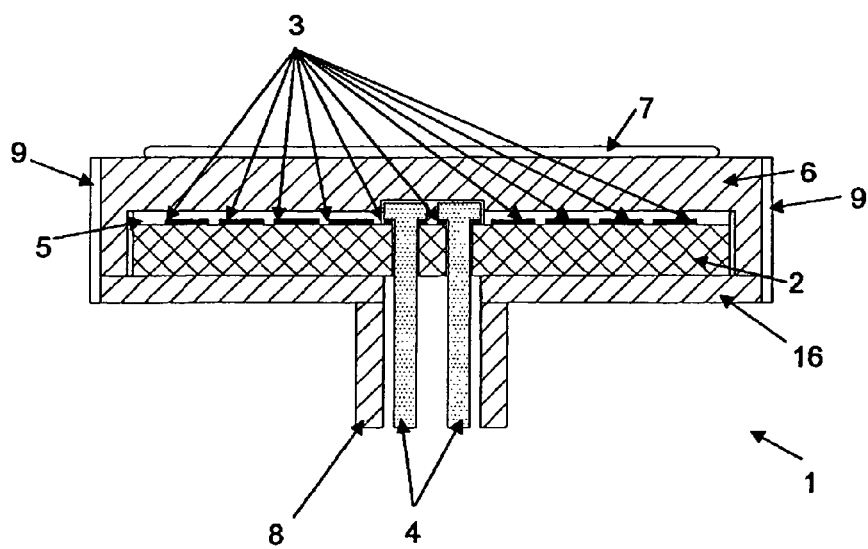

Furthermore, as shown in FIG. 5, by further extends a ceramic protection substrate 16 over the surface of the ceramic support substrate 2 that is opposite to the surface having the electrode layer 3 formed thereon in the corrosion-resistant multilayer ceramic member 1 and further placing the cylindrical column 8 on the ceramic protection substrate 16, the power-supply member 4 may be inserted inside the cylindrical column 8.

It should be noted that, when the cylindrical column 8 is provided for the corrosion-resistant multilayer ceramic member 1 as mentioned above, a surface opposite to a surface having the cylindrical column thereon can be used as a placing surface of the heated object 7.

Furthermore, as shown in FIG. 6(A), in the corrosion-resistant multilayer ceramic member 1, there may be coated a protection film 9 having a thickness of 0.01 mm or more to seal in a surface boundary line at the ceramic support substrate 2 having the electrode layer 3 and the insulating protection layer 5 formed thereon to the ceramic protection substrate 6. Moreover, as shown in FIG. 6(B), in the corrosion-resistant multilayer ceramic member 1, also in the case where the ceramic protection substrate 16 further extends over a surface of the ceramic support substrate 2 that is opposite to the surface having the electrode layer 3 formed thereon, the protection film 9 having a thickness of 0.01 mm or more may be coated to seal in surface boundary lines the ceramic support substrate 2 to the ceramic protection substrates 6 and 16. When the protection film 9 is coated to seal in surface boundary lines as mentioned above, invasion of the corrosive gas to the surface boundary, where the corrosion resistance is relatively poor, is prevented and life can be increased further.

It should be noted that when a protection film is formed in a corrosion-resistant multilayer ceramic member of the present invention, the protection film is preferably made of any one of aluminum nitride, rare earth oxide, yttrium fluoride, aluminum oxide, silicon oxide, zirconia, and sialon. When the protection film, having a thickness of 0.01 mm or more and being coated on an end face of a joining surface joining the ceramic support substrate having the electrode layer and the insulating protection layer formed thereon to the ceramic protection substrate, is made of a substance as mentioned above, the corrosion resistance of the protection film itself is further improved and invasion of a corrosive gas to the joining surface, where the corrosion resistance is relatively poor, is completely prevented.

Furthermore, a ceramic support substrate, a ceramic protection substrate, and an insulating protection layer in a corrosion-resistant multilayer ceramic member of the present invention preferably contain as a main component any one of aluminum nitride, rare earth oxide, aluminum oxide, silicon oxide, zirconia, and sialon. By using a substance as mentioned above, the corrosion-resistant multilayer ceramic member obtained has greater corrosion resistance.

Furthermore, in the present invention, the insulating protection layer is preferably formed by any one of screen printing method, chemical vapor deposition method, and plasma spraying method. The electrode layer is also preferably formed by any one of screen printing method, chemical vapor deposition method, and plasma spraying method. The insulating protection layer and the electrode layer, each formed by the method mentioned above, are excellent in homogeneity. Moreover, because the insulating protection layer and the electrode layer excellent in homogeneity are formed with ease, a corrosion-resistant multilayer ceramic member is obtained with a high yield and at a low cost.

Furthermore, as described above, a corrosion-resistant multilayer ceramic member of the present invention can be used as a heater for heating, an electrostatic chuck, or a heater for heating provided with an electrostatic chuck. When the corrosion-resistant multilayer ceramic member of the present invention is used as a heating apparatus and the like, it is capable of heating by electricity the wafer continuously for a long time even in the case where it is exposed to a corrosive gas used in the production process and the inspection process of a semiconductor wafer, for example. Therefore it has increased life and is economical. For example, in FIGS. 1 to 6, when the corrosion-resistant multilayer ceramic member 1 of the present invention is a heater for heating, the electrode layer 3 is used as an electrode layer for the heater for heating, When the corrosion-resistant multilayer ceramic member 1 is an electrostatic chuck, the electrode layer 3 is used as an electrode layer for the electrostatic chuck.

Furthermore, for example, in a corrosion-resistant multilayer ceramic member of the present invention, when the corrosion-resistant multilayer ceramic member is produced by forming an electrode layer for an electrostatic chuck on a surface of a ceramic support substrate, forming an electrode layer for a heater for heating on another surface. Forming an insulating protection layer on the ceramic support substrate to cover each of the electrode, and joining a ceramic protection substrate to the insulating protection layer to be in contact, facing each of the surface of the ceramic support substrate having the electrode layer for an electrostatic chuck formed thereon and the surface of the ceramic support substrate having the electrode layer for a heater for heating formed thereon. The corrosion-resistant multilayer ceramic member is suitably used, by supplying power from a power-supply member connected to each of the electrode layer, as a heater for heating provided with an electrostatic chuck with improved corrosion resistance.

EXAMPLES

Hereinafter, the present invention will be described by reference to a heat treatment test of the present invention, Examples, and Comparative Example, but the present invention is by no means limited thereto.

Example 1

As an electrode layer for a heater for heating was coated a tungsten paste by a screen printing method on a ceramic support substrate of aluminum nitride 300 mm in outer diameter and 10 mm in thickness. Under a nitrogen atmosphere, at a high temperature of 1700° C., baking of a tungsten electrode was performed for joining, an electrode layer was formed on the ceramic support substrate, and a power-supply member was connected to the electrode layer. Next, aluminum chloride and ammonia were caused to react at 1000° C. to form an insulating protection layer of aluminum nitride 50 μm in thickness and cover the electrode layer. A ceramic protection substrate of aluminum nitride 300 mm in outer diameter and 5 mm in thickness, was provided on the insulating protection layer to produce a corrosion-resistant multilayer ceramic member as shown in FIG. 1(A).

A Si wafer was placed on the ceramic support substrate, supplied with electricity from the power supply member, heated by electricity so that the wafer temperature was 900° C., and exposed to a $CF_4$ plasma gas, which is a corrosive gas to carry out an endurance test. As a result, this corrosion-resistant multilayer ceramic member was capable of stable heating by electricity for as long as 2000 hours continuously.

Example 2

As an electrode layer for a heater for heating was coated a tungsten paste by a screen printing method on a ceramic support substrate of aluminum nitride 300 mm in outer diameter and 10 mm in thickness. Under a nitrogen atmosphere, at a high temperature of 1700° C., baking of a tungsten electrode was performed for joining, an electrode layer was formed on the ceramic support substrate, and a power-supply member was connected to the electrode layer. Next, aluminum chloride and ammonia were caused to react at 1000° C. to form an insulating protection layer of aluminum nitride 10 μm in thickness and cover the electrode layer. A ceramic protection substrate of aluminum nitride 310 mm in outer diameter and 5 mm in thickness, was provided on the insulating protection layer and extended over side surface of the ceramic support substrate to produce a corrosion-resistant multilayer ceramic member as shown in FIG. 2(B).

A Si wafer was placed on the ceramic support substrate, supplied with electricity from the power supply member, heated by electricity so that the wafer temperature was 900° C., and exposed to a $CF_4$ plasma gas, which is a corrosive gas to carry out an endurance test. As a result, this corrosion-resistant multilayer ceramic member was capable of stable heating by electricity for as long as 3000 hours continuously.

Example 3

As an electrode layer for a heater for heating was coated a tungsten paste by a screen printing method on a ceramic support substrate of aluminum nitride 300 mm in outer diameter and 10 mm in thickness. Under a nitrogen atmosphere, at a high temperature of 1700° C., baking of a tungsten electrode was performed for joining, an electrode layer was formed on the ceramic support substrate, and a power-supply member was connected to the electrode layer. Next, aluminum chloride and ammonia were caused to react at 1000° C. to form an insulating protection layer of aluminum nitride 20 μm in thickness. Then, a ceramic protection substrate of aluminum nitride was provided on the insulating protection layer. Next, a corrosion-resistant multilayer ceramic member having a cylindrical column at a side of the ceramic support substrate as shown in FIG. 4(A) and a corrosion-resistant multilayer ceramic member having a cylindrical column at a side of the ceramic protection substrate as shown in FIG. 3(A) were produced. For each, an end of the power-supply member connected to the electrode layer was caused to be inside the cylindrical column.

Used as a placing surface was a surface of either the ceramic protection substrate or the ceramic support substrate opposite to the surface having the cylindrical column formed. A Si wafer was placed on the placing surface and these corrosion-resistant multilayer ceramic members were supplied with electricity from the power supply member, heated by electricity so that the wafer temperature was 900° C., and exposed to a $CF_4$ plasma gas, which is a corrosive gas to carry out an endurance test. As a result, these corrosion-resistant multilayer ceramic members were capable of stable heating by electricity for as long as 4000 hours continuously.

Example 4

As an electrode layer for a heater for heating was coated a tungsten paste by a screen printing method on a ceramic support substrate of aluminum nitride 300 mm in outer diameter and 10 mm in thickness. Under a nitrogen atmosphere, at a high temperature of 1700° C., baking of a tungsten electrode was performed for joining, an electrode layer was formed on the ceramic support substrate, and a power-supply member was connected to the electrode layer. Next, aluminum chloride and ammonia were caused to react at 1000° C. to cover the electrode layer and an insulating protection layer of aluminum nitride 20 μm in thickness was formed. A ceramic protection substrate of aluminum nitride was further joined thereto. After that, yttrium oxide having various thicknesses of 0.01 to 10 mm was deposited by a spraying method throughout a circumference of the surface boundary line of these to form a protection film so that the surface boundary line was covered. A corrosion-resistant multilayer ceramic member having a cylindrical column at a side of the ceramic support substrate as shown in FIG. 6(B) was produced and a corrosion-resistant multilayer ceramic member having a cylindrical column at a side of the ceramic protection substrate as shown in FIG. 6(A) was produced. An end of the power-supply member connected to a heater electrode was caused to be inside the cylindrical column.

A Si wafer was placed on each of the placing surface of the ceramic protection substrate or the ceramic support substrate and these corrosion-resistant multilayer ceramic members were supplied with electricity from the power supply member, heated by electricity so that the wafer temperature was 900° C., and exposed to a $CF_4$ plasma gas, which is a corrosive gas to carry out an endurance test. As a result, these corrosion-resistant multilayer ceramic members were capable of stable heating by electricity for as long as 10000 hours continuously.

It should be noted that a similar result was obtained for any protection film in Example 4 made of aluminum nitride, different rare earth oxide, yttrium fluoride, aluminum oxide, silicon oxide, zirconia, or sialon. Furthermore, a similar result was achieved for any ceramic support substrate, ceramic protection substrate, and insulating protection layer in Examples 1 to 4 made of rare earth oxide, aluminum oxide, silicon oxide, zirconia, or sialon.

Comparative Example 1

As an electrode layer for a heater for heating was coated a tungsten paste by a screen printing method on a ceramic support substrate of aluminum nitride 300 mm in outer diameter and 10 mm in thickness. Under a nitrogen atmosphere, at a high temperature of 1700° C., baking of a tungsten electrode was performed for joining, an electrode layer was formed on the ceramic support substrate, and a power-supply member was connected to the electrode layer. Next, aluminum chloride and ammonia were caused to react at 1000° C. to cover the electrode layer and a ceramic member was produced only by forming an insulating protection layer of aluminum nitride 15 μm in thickness without joining a ceramic protection substrate.

A Si wafer was placed on the ceramic member, heated by electricity so that the wafer temperature was 900° C., and exposed to a $CF_4$ plasma gas, which is a corrosive gas to carry out an endurance test. As a result, in less than 1000 hours of continuous electricity supply, a part of the insulating protection layer was corroded to an electrode layer and the electrode was broken so that the power supply was impossible.

As described above, in a corrosion-resistant multilayer ceramic member of the present invention, by forming an electrode layer on a ceramic support substrate, forming an insulating protection layer thereon to cover the electrode layer, and at least providing a ceramic protection substrate on the insulating protection layer, resistance to a corrosive gas is greatly improved to provide a long-life corrosion-resistant multilayer ceramic member.

The present invention is not limited to the embodiment described above. The above-described aspects are mere examples and those having substantially the same structure as technical ideas described in the appended claims and providing the similar functions and advantages are included in the scope of the present invention.

What is claimed is:

1. A corrosion-resistant multilayer ceramic member comprising:
    a ceramic support substrate having a first surface, a second surface opposite to the first surface, and a side surface extending from the first surface to the second surface;
    an electrode layer formed on and in direct contact with the first surface of the ceramic support substrate;
    a power-supply member connected to the electrode layer;
    an insulating protection layer covering and in direct contact with the electrode layer, the electrode layer being between the ceramic support substrate and the insulating protection layer;
    a ceramic protection substrate comprising:
        a first portion provided on the insulating protection layer, the insulating protection layer being between the first portion of the ceramic protection substrate and the electrode layer,
        a second portion in direct contact with the first portion, the second portion extending in a direction from the first portion to at least the second surface of the ceramic support substrate, the second portion covering the side surface of the ceramic support substrate, and
        a third portion in direct contact with the second portion, the third portion extending over at least a portion of the second surface of the ceramic support substrate, the ceramic support substrate being between the first and thin portions of the ceramic protection substrate; and
    a cylindrical column attached to the third portion of the ceramic protection substrate, the cylindrical column housing least a portion of the power-supply member;
    wherein the ceramic support substrate, the ceramic protection substrate, and the insulating protection layer contain as a main component any one of aluminum nitride, rare earth oxide, aluminum oxide, silicon oxide, zirconia, and sialon.

2. The corrosion-resistant multilayer ceramic member according to claim 1, wherein a protection film 0.01 mm or more in thickness is coated to seal in at least one of surface boundary lines at which the ceramic support substrate, the insulating protection layer, the ceramic protection substrate, or the cylindrical column meet with each other or itself.

3. The corrosion-resistant multilayer ceramic member according to claim 2, wherein the protection film is made of any one of aluminum nitride, rare earth oxide, yttrium fluoride, aluminum oxide, silicon oxide, zirconia, and sialon.

4. The corrosion-resistant multilayer ceramic member according to claim 1 serving as any one of a heater for heating, an electrostatic chuck, and a heater for heating provided with an electrostatic chuck.

* * * * *